United States Patent
Do et al.

(10) Patent No.: US 8,937,379 B1
(45) Date of Patent: Jan. 20, 2015

(54) INTEGRATED CIRCUIT PACKAGING SYSTEM WITH TRENCHED LEADFRAME AND METHOD OF MANUFACTURE THEREOF

(71) Applicants: Byung Tai Do, Singapore (SG); Asri Yusof, Singapore (SG); Arnel Senosa Trasporto, Singapore (SG); Linda Pei Ee Chua, Singapore (SG)

(72) Inventors: Byung Tai Do, Singapore (SG); Asri Yusof, Singapore (SG); Arnel Senosa Trasporto, Singapore (SG); Linda Pei Ee Chua, Singapore (SG)

(73) Assignee: STATS ChipPAC Ltd., Singapore (SG)

(*) Notice: Subject to any disclaimer, the term of this patent is extended or adjusted under 35 U.S.C. 154(b) by 0 days.

(21) Appl. No.: 13/934,797

(22) Filed: Jul. 3, 2013

(51) Int. Cl.
*H01L 23/495* (2006.01)
*H01L 23/00* (2006.01)

(52) U.S. Cl.
CPC .......... *H01L 23/49541* (2013.01); *H01L 24/89* (2013.01)
USPC ........... 257/676; 257/666; 257/767; 438/123; 438/125

(58) Field of Classification Search
USPC .......... 438/123, 124, 125; 257/666, 669, 672, 257/767
See application file for complete search history.

(56) References Cited

U.S. PATENT DOCUMENTS

| | | | | |
|---|---|---|---|---|
| 5,334,872 | A * | 8/1994 | Ueda et al. | 257/675 |
| 5,789,280 | A * | 8/1998 | Yokota | 438/123 |
| 8,106,492 | B2 | 1/2012 | Chang Chien et al. | |
| 2003/0073265 | A1* | 4/2003 | Hu et al. | 438/123 |
| 2003/0209815 | A1* | 11/2003 | Ito et al. | 257/797 |
| 2005/0124091 | A1 | 6/2005 | Fukase et al. | |
| 2009/0280603 | A1* | 11/2009 | Qiao et al. | 438/124 |
| 2010/0254182 | A1* | 10/2010 | Kuroiwa et al. | 365/158 |
| 2011/0133327 | A1* | 6/2011 | Hsu et al. | 257/692 |
| 2012/0280376 | A1 | 11/2012 | Do et al. | |
| 2012/0280377 | A1* | 11/2012 | Do et al. | 257/676 |

* cited by examiner

Primary Examiner — Phuc Dang
(74) Attorney, Agent, or Firm — Ishimaru & Associates LLP

(57) ABSTRACT

A method of manufacture of an integrated circuit packaging system includes: providing a leadframe having a trench; mounting an integrated circuit device on the leadframe; forming a top encapsulation on the leadframe and the trench; forming a lead having a lead protrusion and a peripheral groove, the lead protrusion and the peripheral groove formed from etching the trench at a leadframe bottom side; and forming a bottom encapsulation surrounding a lead bottom side of the lead.

9 Claims, 6 Drawing Sheets

US 8,937,379 B1

INTEGRATED CIRCUIT PACKAGING SYSTEM WITH TRENCHED LEADFRAME AND METHOD OF MANUFACTURE THEREOF

TECHNICAL FIELD

The present invention relates generally to an integrated circuit packaging system, and more particularly to a system with a trenched leadframe.

BACKGROUND ART

The integrated circuit package is the building block used in a high performance electronic system to provide applications for usage in products such as automotive vehicles, pocket personal computers, cell phone, intelligent portable military devices, aeronautical spacecraft payloads, and a vast line of other similar products that require small compact electronics supporting many complex functions.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages using electrical connections.

Products must compete in world markets and attract many consumers or buyers in order to be successful. It is very important for products to continue to improve in features, performance, and reliability while reducing product costs, product size, and to be available quickly for purchase by the consumers or buyers.

The amount of circuitry and the amount of electrical connections inside a product are key to improving the features, performance, and reliability of any product. Furthermore, the ways the circuitry and electrical connections are implemented can determine the packaging size, packaging methods, and the individual packaging designs. Attempts have failed to provide a complete solution addressing simplified manufacturing processing, smaller dimensions, lower costs due to design flexibility, increased functionality, leveragability, and increased IO connectivity capabilities.

Thus, a need still remains for an integrated circuit system for improved yield, thermal cooling, low profile, and improved reliability. In view of the ever-increasing commercial competitive pressures, along with growing consumer expectations and the diminishing opportunities for meaningful product differentiation in the marketplace, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including: providing a leadframe having a trench; mounting an integrated circuit device on the leadframe; forming a top encapsulation on the leadframe and the trench; forming a lead having a lead protrusion and a peripheral groove, the lead protrusion and the peripheral groove formed from etching the trench at a leadframe bottom side; and forming a bottom encapsulation surrounding a lead bottom side of the lead.

The present invention provides an integrated circuit packaging system including: a die paddle; a lead adjacent to the die paddle, the lead having a peripheral groove and a lead protrusion; an integrated circuit device on the die paddle; a top encapsulation covering the integrated circuit device, a lead top side of the lead, the peripheral groove, and the lead protrusion; and a bottom encapsulation surrounding a lead bottom side of the lead, the lead protrusion over the bottom encapsulation for anchoring the lead to the bottom encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
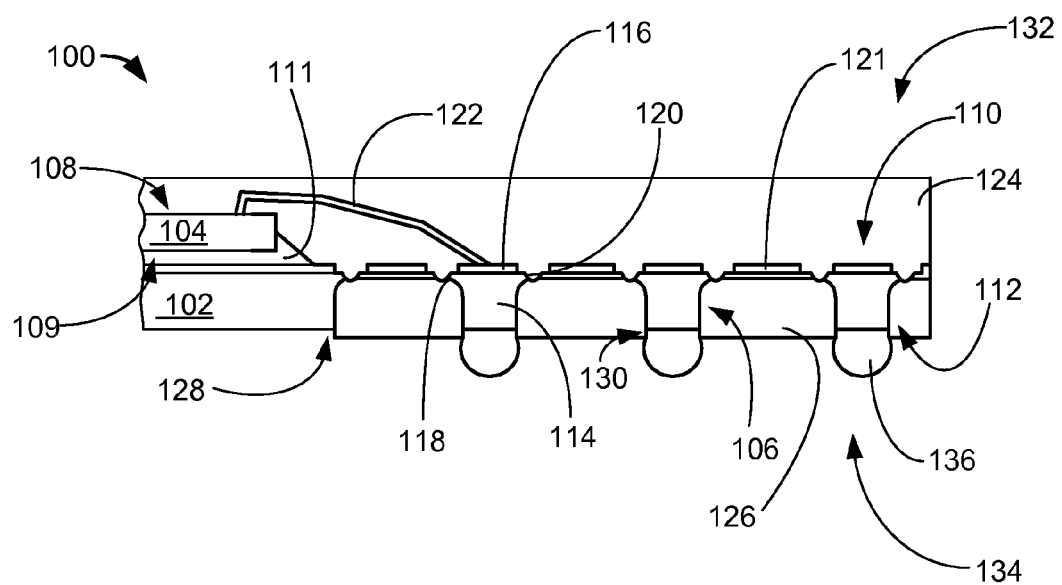
FIG. 1 is a cross-sectional view of the integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

The same numbers are used in all the drawing FIGS. to relate to the same elements. The embodiments have been numbered first embodiment, second embodiment, etc. as a matter of descriptive convenience and are not intended to have any other significance or provide limitations for the present invention.

The term "processing" as used herein includes deposition of material or photoresist, patterning, exposure, development, etching, cleaning, and/or removal of the material or photoresist as required in forming a described structure. The term "active side" refers to a side of a die, a module, a package, or an electronic structure having active circuitry fabricated thereon or having elements for connection to the active circuitry within the die, the module, the package, or the electronic structure.

For expository purposes, the term "horizontal" as used herein is defined as a plane parallel to the active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means there is direct physical contact between elements. The term "directly on" means there is direct physical contact between elements with no intervening elements. The term "processing" as used herein includes deposition of material, patterning, exposure, development, etching, cleaning, molding, and/or removal of the material or as required in forming a described structure.

Figure 2:
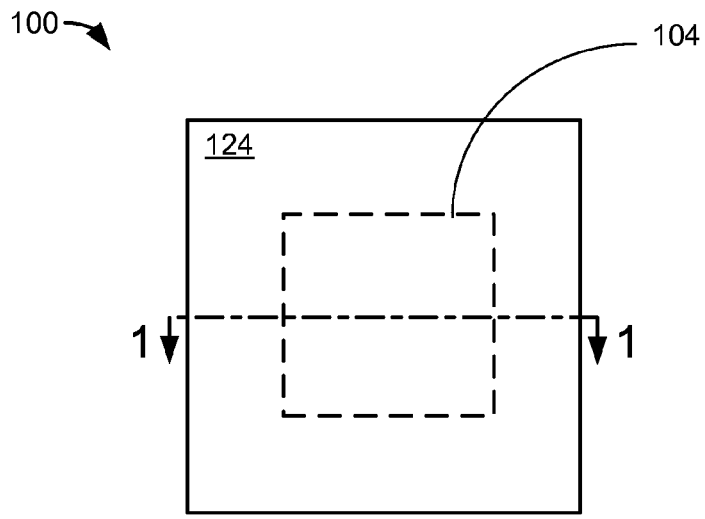
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 is shown having a die paddle 102, an integrated circuit device 104, and a lead 106.

The die paddle 102 provides structural support for semiconductor devices mounted thereon. The die paddle 102 can include a core of conductive material, metal, or alloy such as copper as an example.

The integrated circuit device 104 is defined as a semiconductor device having one or more integrated transistors for implementing active circuitry. For example, the integrated circuit device 104 can include interconnects, passive devices, or a combination thereof. The integrated circuit device 104 is preferably shown in a wire-bonded configuration. However, the integrated circuit device 104 can also be in a flip-chip configuration based on the configuration of the integrated circuit packaging system 100.

The integrated circuit device 104 can include an interconnect side 108 for electrically connecting the integrated circuit device 104 to the lead 106. The interconnect side 108 can include contacts, fabricated thereon, and can be a side of the integrated circuit device 104 facing away from the die paddle 102.

The integrated circuit device 104 can also include a device bottom side 109 which is a side opposite the interconnect side 108. The device bottom side 109 of the integrated circuit device 104 can be attached to the die paddle 102.

The lead 106 can be formed in a number of rows surrounding and spaced from the integrated circuit device 104 and the die paddle 102. For example, a plurality of the lead 106 can be arranged in an array surrounding the die paddle 102 and the integrated circuit device 104. The lead 106 can include a lead top side 110, a lead bottom side 112, a lead body 114, and a top ball pad 116.

The lead top side 110 is the top side of the lead 106, which faces in the same direction as the interconnect side 108. The lead bottom side 112 is the bottom side of the lead 106 facing opposite to the lead top side 110.

The lead body 114 provides the base structure of the lead 106 on which conductive structures can be formed thereon. The lead body 114 can be made from a variety of materials including copper, tin, zinc, other conductive metals, or metal alloy as examples.

The top ball pad 116 can be formed on the lead body 114 at the lead top side 110. The top ball pad 116 can be made from metals including gold, silver, nickel, other conductive metal, or a combination thereof as examples. The diameter of the top ball pad 116 can include a range of 250-400 μm as the configuration of the lead 106 allows for larger sized pads on the top of the lead body 114. A portion of the lead body 114 can border the lateral sides of the top ball pad 116 at the lead top side 110 forming a ring around the top ball pad 116. The ring will be explained in further detail below.

The lead body 114 can include a lead protrusion 118 on a non-horizontal side of the lead body 114. The lead protrusion 118 extends from the lead top side 110 and the lead bottom side 112 of the lead 106 to form a lateral tip at the non-horizontal side of the lead body 114. The lead protrusion 118 extends around the perimeter of the lead body 114 and the lead protrusion 118 is below the top ball pad 116.

The lead 106 can also include a peripheral groove 120. The peripheral groove 120 is formed on the lead protrusion 118 at the lead top side 110 of the lead 106. The peripheral groove 120 extends from the lead body 114 at the lead top side 110 and ends at the lead protrusion 118.

The peripheral groove 120 extends around the perimeter of the lead protrusion 118 forming an indented ring below the lead top side 110. The integrated circuit packaging system 100 can include traces extending from the top ball pad 116 (not shown in cross-sectional view). The traces will be described in further detail below.

The integrated circuit packaging system 100 can include a support pad 121. The support pad 121 can be arranged between the lead 106 and the die paddle 102 on a lateral plane. The support pad 121 can also be arranged between the lead 106 and another of the lead 106 on a lateral plane for preserving spacing of the lead 106 and another of the lead 106.

The integrated circuit packaging system 100 can include an attach layer 111 between the device bottom side 109 of the integrated circuit device 104 and the die paddle 102 for mounting the integrated circuit device 104 on the lead top side 110. The attach layer 111 can include a die attach, an adhesive tape, an adhesive film, a thermally conductive material, an epoxy paste, or other adhesive as examples.

The integrated circuit packaging system 100 can include a chip interconnect 122. The chip interconnect 122 provides an electrical connection and can include a bond wire, a solder ball, or a solder pillar as examples. For illustrative purposes, the chip interconnect 122 is shown as a bond wire. The chip interconnect 122 can connect the top ball pad 116 at the lead top side 110 to the interconnect side 108 of the integrated circuit device 104. The chip interconnect 122 provides electrical connectivity from the lead 106 to the integrated circuit device 104.

The integrated circuit packaging system 100 can include a top encapsulation 124 and a bottom encapsulation 126. The top encapsulation 124 covers the integrated circuit device 104, the chip interconnect 122, a portion of the die paddle 102, and the lead top side 110 of the lead 106 and provides mechanical protection, environmental protection, and a hermetic seal for the integrated circuit packaging system 100. The top encapsulation 124 can be made from an epoxy molding compound (EMC), film assisted molding, polymide compound, or a wire-in-film (WIF), as examples.

The bottom encapsulation 126 covers the lead 106 at the lead bottom side 112, a bottom portion of the support pad 121 and partially covers the die paddle 102. The bottom encapsulation 126 can be made from an epoxy molding compound (EMC), film assisted molding, polymide compound, or a wire-in-film (WIF), as examples. The lead protrusion 118 can hook into the top surface of the bottom encapsulation 126 for preventing pull-out of the lead 106.

The bottom encapsulation 126 can include a paddle recess 128 and a system recess 130. The paddle recess 128 is an opening in the bottom encapsulation 126 for exposing the die paddle 102 from the bottom encapsulation 126.

The system recess 130 is an opening in the bottom encapsulation 126 for exposing the lead bottom side 112 of the lead from the bottom encapsulation 126. The system recess 130 and the paddle recess 128 can have a clearance height of 5-30 µm from the bottom surface of the bottom encapsulation 126 to the bottom surface of the die paddle 102 or the bottom surface of the lead 106.

The integrated circuit packaging system 100 can include a package top side 132 and a package bottom side 134 opposite to the package top side 132. The package top side 132 can include the top surface of the top encapsulation 124 and is the side of the integrated circuit packaging system 100 facing in the same direction as the interconnect side 108.

The package bottom side 134 can include the bottom surface of the bottom encapsulation 126 and is the side of the integrated circuit packaging system 100 facing in the same direction as the device bottom side 109.

The integrated circuit packaging system 100 can include a system interconnect 136. The system interconnect 136 can be attached to the lead bottom side 112 of the lead 106 for attaching the integrated circuit packaging system 100 to the next level system (not shown). The system interconnect 136 can include solder balls, solder dots, solder pillars, or a conductive bump as examples.

It has been discovered that the peripheral groove 120 at the lead top side 110 of the lead 106 preserves the dimension size of the top ball pad 116. The pre-etched area at the peripheral groove 120 reduces etching time during isolation of the lead 106 and reduces unnecessary chemical wastage of the pre-etched leadframe. The reduction in chemical exposure during etching allows for bigger and more adequately sized dimensions for the top ball pad 116 and leadframe material at the lead top side 110, while saving costs and increasing manufacturing efficiency. Further, it has been found that the etching time of the pre-etched leadframe is reduced from 21% to 28% or a reduction from an average time of 70 seconds to 50-55 seconds to complete the chemical exposure cycle.

It has been discovered that the paddle recess 128 and the system recess 130 decrease package profile by decreasing the height of the system interconnect 136 attached to the lead 106. The system recess 130 also provides additional clearance area for devices and components mounted below the die paddle 102 of the integrated circuit packaging system 100. It has also been discovered that the system recess 130 provides environmental protection and isolation for the system interconnect 136 while also reducing the package profile of the integrated circuit packaging system 100.

It has been discovered that the lead protrusion 118 provides mold locking for the lead 106 in the bottom encapsulation 126, which prevents lead pull-out and shifting of the lead 106. The lead protrusion 118 anchors the lead 106 to the bottom encapsulation 126 preventing pull-out from the lead bottom side 110. It has also been discovered that the peripheral groove 120 provides mold locking for the lead 106 in the top encapsulation 124, which prevents lead pull-out and shifting of the lead 106.

Referring now to FIG. 2, therein is shown a top view of the integrated circuit packaging system 100. The integrated circuit packaging system 100 is shown having the top encapsulation 124. For illustrative purposes, dash lines show the outline of the integrated circuit device 104 of FIG. 1 under the top encapsulation 124.

Figure 3:
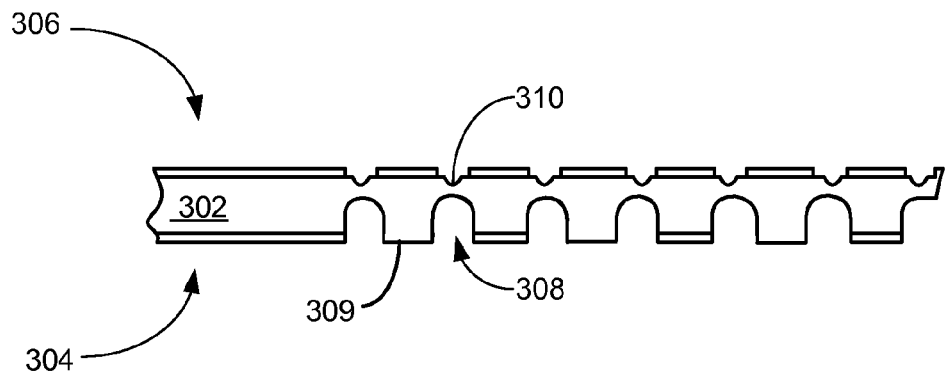
FIG. 3 a partial cross-sectional view of the integrated circuit packaging system of FIG. 1 in an incoming-leadframe phase of manufacture.

Referring now to FIG. 3, therein is shown a partial cross-sectional view of the integrated circuit packaging system 100 of FIG. 1 in an incoming-leadframe phase of manufacture. A leadframe 302 is provided.

The leadframe 302 can include a leadframe bottom side 304 and a leadframe top side 306 opposite to the leadframe bottom side 304. The leadframe 302 can be pre-etched including etching at the leadframe bottom side 304 and the leadframe top side 306. The leadframe 302 can include a pre-plated leadframe (PPF) with plating at the leadframe bottom side 304 and the leadframe top side 306 and routable traces along the leadframe top side 306.

The leadframe 302 can include a sacrificial recess 308 and a trench 310. The sacrificial recess 308 in the leadframe 302 can be in the leadframe bottom side 304 and can be below and between the support pad 121 of FIG. 1 and the top ball pad 116 of FIG. 1.

The sacrificial recess 308 provides access to portions of the leadframe 302 that will subsequently be etched away for forming the die paddle 102 of FIG. 1 and the lead 106 of FIG. 1. The sacrificial recess 308 can be formed by stamping, etching, or laser ablation as examples.

The leadframe 302 can include a sacrificial body 309, which is a portion of the leadframe 302 that will be etched away in subsequent manufacturing steps. For example, the sacrificial body 309 will be etched away to form the support pad 121 of FIG. 1.

The sacrificial body 309 is without pre-plating and this distinguishes the sacrificial body 309 from the lead 106. The sacrificial body 309 prevents bulging and lateral shifting of the lead 106 and another of the lead 106. The sacrificial body 309 can be etched after molding in subsequent manufacturing steps.

The trench 310 in the leadframe 302 can be on the leadframe top side 306 for separating the support pad 121 from the top ball pad 116 of FIG. 1. The trench 310 designates and preserves the area of the leadframe top side 306 for the top ball pad 116 of FIG. 1. In subsequent manufacturing steps, the bottom surface of the trench 310 will be etched away to form and isolate the lead 106 from adjacent structures. The trench 310 in on the leadframe top side 306 will be described in greater detail below.

Figure 4:
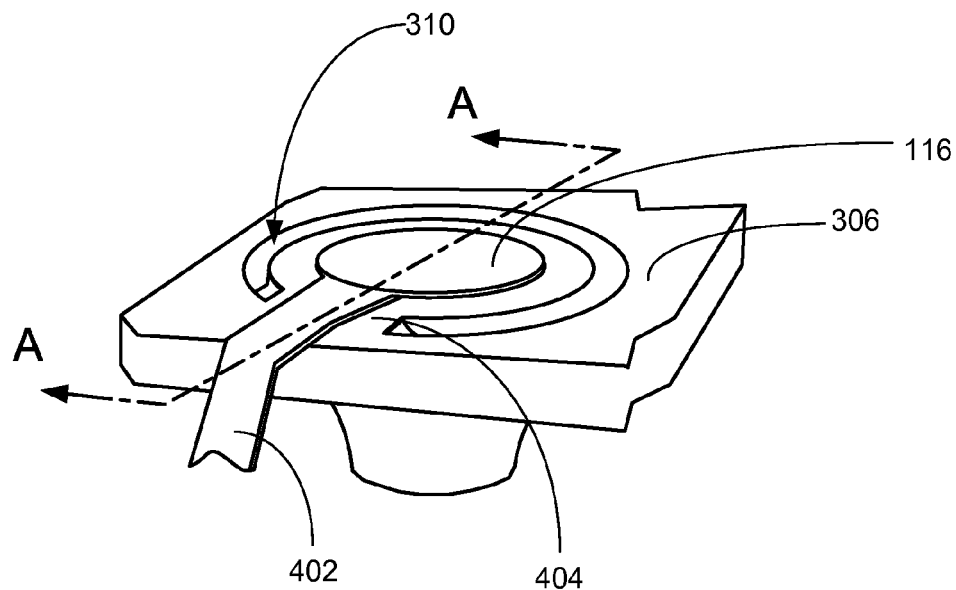
FIG. 4 is an isometric detailed view of the leadframe of FIG. 3.

Referring now to FIG. 4, therein is shown an isometric detailed view of the leadframe 302 of FIG. 3. The isometric view includes the top ball pad 116, the trench 310, and a trace 402.

The trace 402 extends from the top ball pad 116. The trace 402 runs along the leadframe top side 306 for providing a routable conductive connection for the integrated circuit packaging system 100.

The leadframe 302 includes a sacrificial trench region 404, which is a portion of the leadframe 302 below the trace 402 that is not pre-etched and which forms an endpoint for the trench 310. The trench 310 on the leadframe top side 306 borders or surrounds the top ball pad 116 except at the sacrificial trench region 404. For example, the trench 310 does not make a complete ring around the top ball pad 116 because the trench 310 ends at the sacrificial trench region 404.

The sacrificial trench region 404 is a portion of the leadframe 302 directly under the trace 402. The sacrificial trench region 404 provides a platform for supporting the forming of the trace 402. The leadframe 302 includes a portion of the lead body 114 of FIG. 1 bordering the top ball pad 116 at the leadframe top side 306. The sacrificial trench region 404 can be removed in subsequent manufacturing steps.

Figure 5:
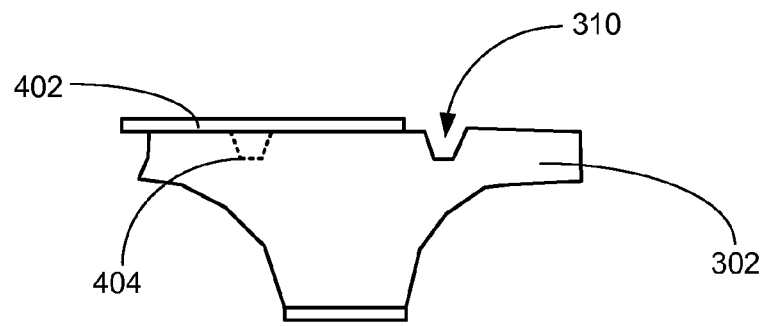
FIG. 5 is a detailed cross-sectional view of the leadframe taken along line A-A of FIG. 4.

Referring now to FIG. 5, therein is shown a detailed cross-sectional view of the leadframe 302 taken along line A-A of FIG. 4. The detailed cross-sectional shows dotted lines to illustrate the sacrificial trench region 404 under the trace 402. The trench 310 is shown bordering one lateral side of the trace 402. In subsequent manufacturing steps, the sacrificial trench region 404 is removed to isolate and form the lead 106 of FIG. 1.

Figure 6:
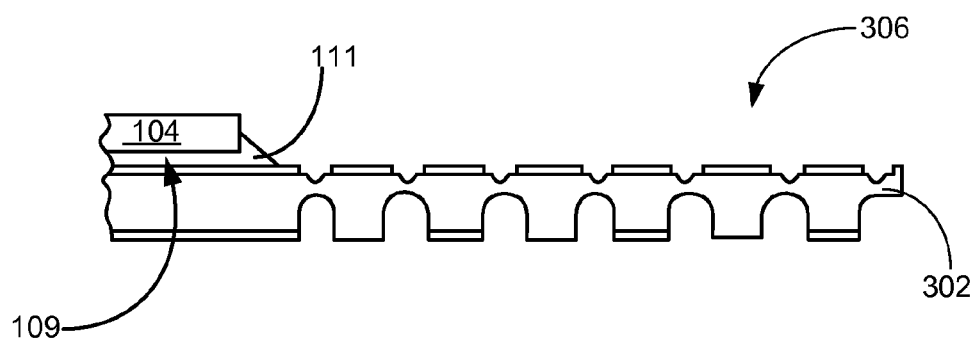
FIG. 6 is the structure of FIG. 3 in a die mounting phase of manufacture.

Referring now to FIG. 6, therein is shown the structure of FIG. 3 in a die mounting phase of manufacture. The integrated circuit device 104 and the attach layer 111 can be mounted on a portion of the leadframe 302 that will be the die paddle 102 of FIG. 1.

The attach layer 111 can be applied to the device bottom side 109 of the integrated circuit device 104 for mounting on the leadframe top side 306. The attach layer 111 can include a die attach, an adhesive tape, an adhesive film, a thermally conductive material, an epoxy paste, or other adhesive as examples.

Figure 7:
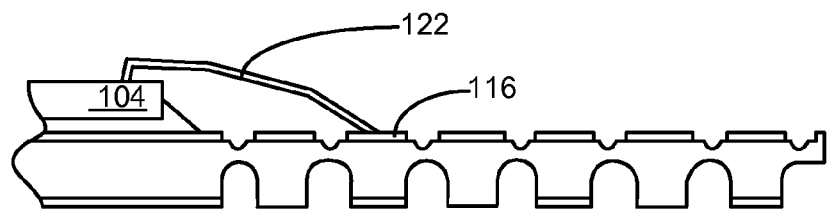
FIG. 7 is the structure of FIG. 6 in a wire-attachment phase of manufacture.

Referring now to FIG. 7, therein is shown the structure of FIG. 6 in a wire-attachment phase of manufacture. The chip interconnect 122 can be wire-bonded between the integrated circuit device 104 and the top ball pad 116 for providing an electrical connection.

Figure 8:
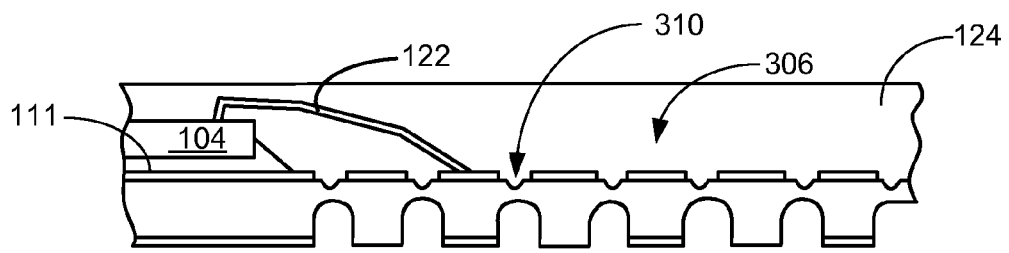
FIG. 8 is the structure of FIG. 7 in a leadframe-encapsulation phase of manufacture.

Referring now to FIG. 8, therein is shown the structure of FIG. 7 in a leadframe-encapsulation phase of manufacture. The top encapsulation 124 is formed to cover the integrated circuit device 104, the chip interconnect 122, and the leadframe top side 306. The top encapsulation 124 also covers the trench 310 and portions of the attach layer 111. The top encapsulation 124 can include an epoxy molding compound (EMC), film assisted molding, polymide compound, or a wire-in-film (WIF) as examples.

Figure 9:
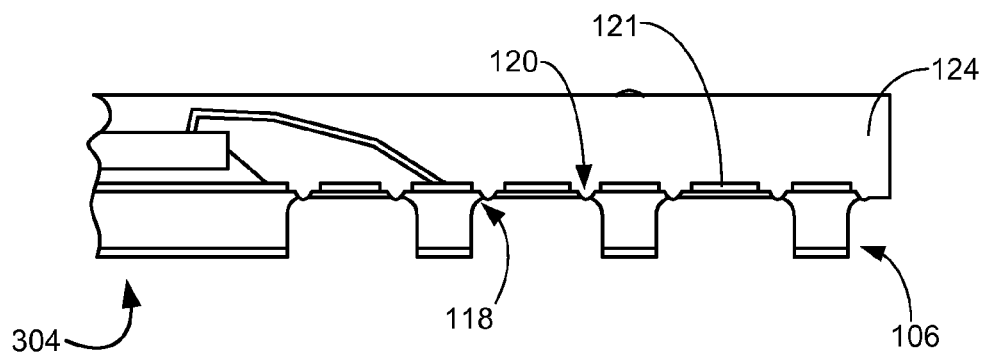
FIG. 9 is the structure of FIG. 8 in a lead-formation phase of manufacture.

Referring now to FIG. 9, therein is shown the structure of FIG. 8 in a lead-formation phase of manufacture. The leadframe 302 of FIG. 8 can be further processed for forming a plurality of the lead 106. The leadframe 302 can be processed through various methods including etching, drilling, or cutting as examples.

For example, the leadframe 302 can be etched at the leadframe bottom side 304 for fully isolating the lead 106 from the support pad 121 and another of the lead 106. After the lead-formation step, the lead protrusion 118 can be formed between the lead 106 and the support pad 121. The lead protrusion 118 can be formed from the junction of the curved corners formed by the etching process on the non-horizontal side of the lead 106.

The etching process can remove a portion of the leadframe 302 below the trench 310 of FIG. 3 for forming the peripheral groove 120. The bottom surface of the trench 310 can be removed for exposing a portion of the top encapsulation 124 from the leadframe 302. The etching process also removes the sacrificial body 309 of FIG. 3 for forming the support pad 121.

It has been discovered that the encapsulation of the trench 310 and the forming of the peripheral groove 120 provides mold locking of the lead 106 preventing pull-out. It has also been discovered that the etching of the trench 310 prevents undercutting of the lead 106 below the top ball pad 116, which provides a more reliable connection between the top ball pad 116 and the lead 106. It has also been discovered that the trench 310 reduces the etching required to form the lead 106, which preserves the size of the lead 106 and allows for larger lead sizes.

Figure 10:
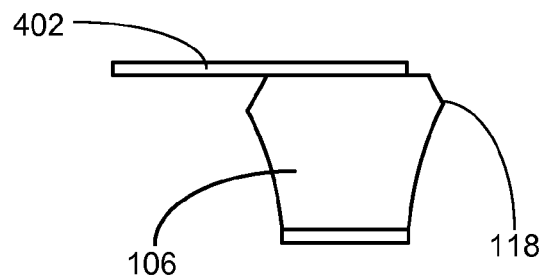
FIG. 10 is a detailed cross-sectional view of the lead after the lead-formation phase of manufacture.

Referring now to FIG. 10, therein is shown a detailed cross-sectional view of the lead 106 after the lead-formation phase of manufacture. The lead protrusion 118 is formed from the etching of the leadframe 302 of FIG. 8 from the leadframe bottom side 304 of FIG. 3. The etching process also removes the sacrificial trench region 404 of FIG. 4 below the trace 402.

Figure 11:
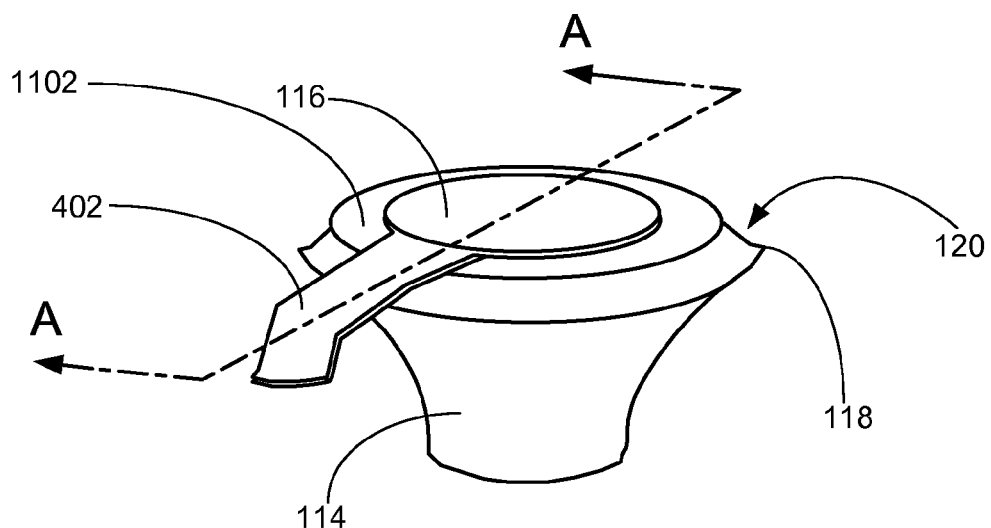
FIG. 11 is an isometric detailed view of the structure of FIG. 10.

Referring now to FIG. 11, therein is shown an isometric detailed view of the structure of FIG. 10. The isometric view includes the top ball pad 116, the peripheral groove 120, the trace 402, the lead body 114, and the lead protrusion 118.

After the lead-formation phase, a top ring 1102 of the lead 106 of FIG. 10 is formed at the lead top side 110 of FIG. 1. The top ring 1102 is a portion of the lead body 114 at the lead top side 110. The top ring 1102 surrounds the top ball pad 116 and supports a portion of the trace 402 that extends across the surface of the top ring 1102. The top ring 1102 is coplanar with the top ball pad 116 and the trace 402.

The peripheral groove 120 forms a ring that is below and surrounds the top ring 1102. A portion of the trace 402 is supported on the top ring 1102 and extends over the gap created by the peripheral groove 120.

It has been discovered that the top ring 1102 provides a support structure for the trace 402, which prevents the trace 402 from bending and making contact with the peripheral groove 120. It has also been discovered that the top ring 1102 and the peripheral groove 120 prevents undercutting of the top ball pad 116 during the lead-formation phase. The top ring 1102 maintains a buffer area of the lead body 114 of FIG. 1 for providing a reliable connection between the top ball pad 116 and the lead 106 because undercutting below the top ball pad 116 is prevented.

Figure 12:
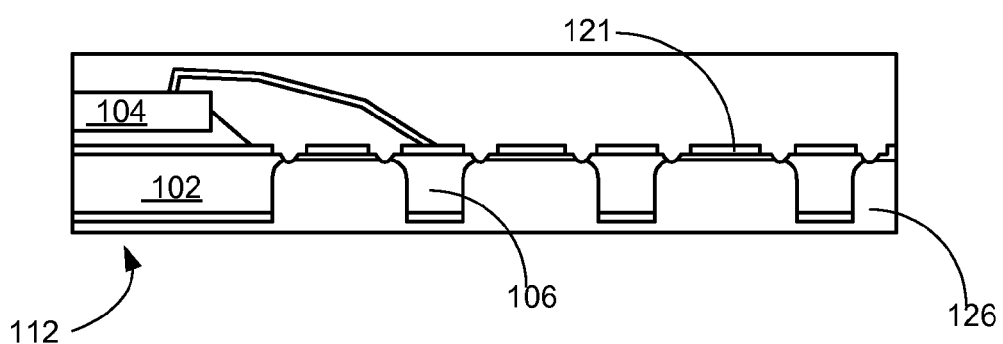
FIG. 12 is shown the structure of FIG. 8 in a lead-bottom encapsulation phase of manufacture.

Referring now to FIG. 12, therein is shown the structure of FIG. 9 in a lead-bottom encapsulation phase of manufacture. The bottom encapsulation 126 is formed to cover the die paddle 102, the lead bottom side 112 of the lead 106, and the bottom surface of the support pad 121. The bottom encapsulation 126 can include an epoxy molding compound (EMC), film assisted molding, polymide compound, or a wire-in-film (WIF) as examples.

The bottom encapsulation 126 can cover the die paddle 102 and the lead bottom side 112 of the lead 106 with a height of 2-10 µm. The bottom encapsulation 126 can also be coplanar with the bottom surface of the die paddle 102 and the lead bottom side 112. Alternatively, the height of the bottom encapsulation 126 can be lower than the height of the lead bottom side 112. The height of 2-10 µm can provide protection and isolation for the die paddle 102 and the lead bottom side 112 while decreasing the profile height of the package.

It has been discovered that the lead protrusion 118 of FIG. 1 provides mold locking for the lead 106 in the bottom encapsulation 126, which prevents lead pull-out and shifting of the lead 106. The lead protrusion 118 anchors the lead 106 to the top surface of the bottom encapsulation 126 preventing pull-out from the lead bottom side 112. It has also been discovered that the peripheral groove 120 provides mold locking for the lead 106 in the top encapsulation 124, which prevents lead pull-out and shifting of the lead 106.

Figure 13:
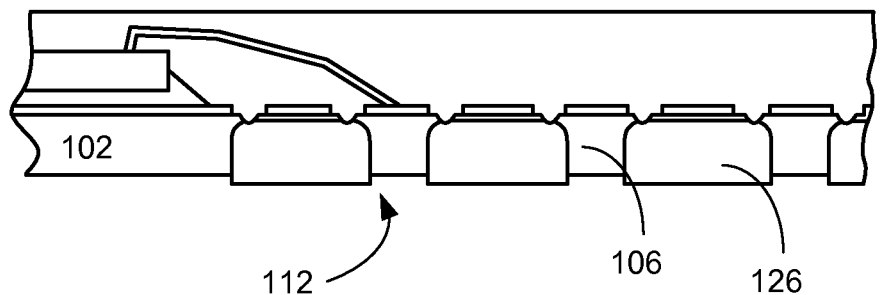
FIG. 13 is the structure of FIG. 12 in a recess creation phase of manufacture.

Referring now to FIG. 13, therein is shown the structure of FIG. 12 in a recess creation phase of manufacture. The bottom encapsulation 126 can be back grinded to expose the bottom surface of the die paddle 102 and the lead bottom side 112. The exposed portions of the die paddle 102 and the lead 106 can be further etched. The recess creation phase creates the paddle recess 128 of FIG. 1 and the system recess 130 of FIG. 1.

It has been discovered that the etching of the exposed portions of the die paddle 102 and the lead 106 in the recess creation phase can remove plating from the lead bottom side 112 for solder joint strength improvement.

Figure 14:
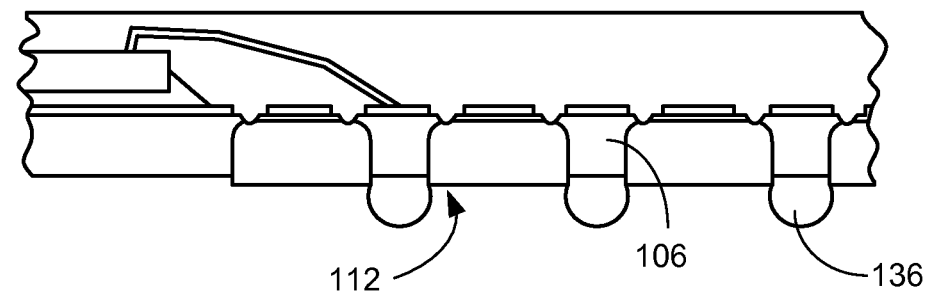
FIG. 14 is shown the structure of FIG. 13 in a ball-attach phase of manufacture.

Referring now to FIG. 14, therein is shown the structure of FIG. 13 in a ball-attach phase of manufacture. The system interconnect 136 is attached to the lead bottom side 112 of the lead 106. The system interconnect 136 can provide an electrical connection from the lead to the next level system (not shown). The package can be singulated if a strip or wafer level scale of manufacturing is used.

Figure 15:
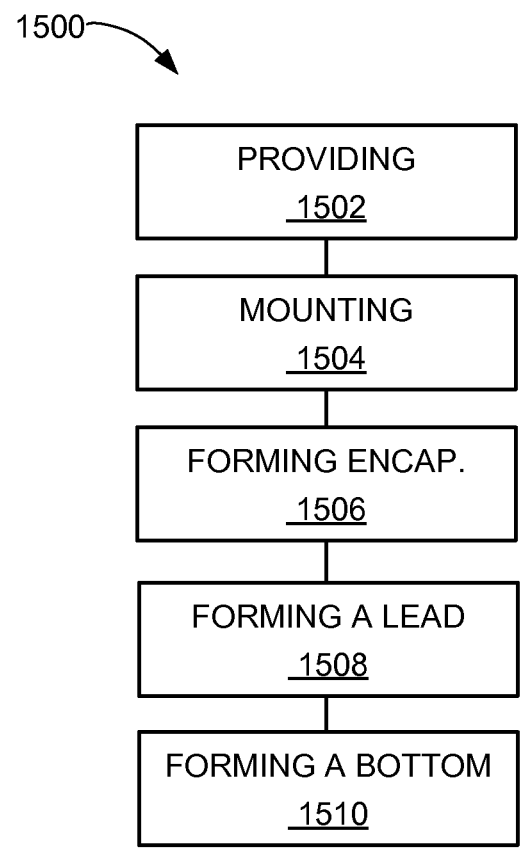
FIG. 15 is a flow chart of a method of manufacture of the integrated circuit packaging system in a further embodiment of the present invention.

Referring now to FIG. 15, therein is shown a flow chart of a method 1500 of manufacture of the integrated circuit packaging system 100 in a further embodiment of the present invention. The method 1500 providing a leadframe having a trench in a block 1502; mounting an integrated circuit device on the leadframe in a block 1504; forming a top encapsulation on the leadframe and the trench in a block 1506; forming a lead having a lead protrusion and a peripheral groove, the lead protrusion and the peripheral groove formed from etching the trench at a leadframe bottom side in a block 1508; and forming a bottom encapsulation surrounding a lead bottom side of the lead in a block 1510.

Thus, it has been discovered that the integrated circuit packaging system of the present invention furnishes important and heretofore unknown and unavailable solutions, capabilities, and functional aspects for mold interlock. The resulting method, process, apparatus, device, product, and/or system is straightforward, cost-effective, uncomplicated, highly versatile and effective, can be surprisingly and non-obviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   a die paddle;
   a lead adjacent to the die paddle, the lead having a peripheral groove and a lead protrusion;
   an integrated circuit device on the die paddle;
   a top encapsulation covering the integrated circuit device, a lead top side of the lead, the peripheral groove, and the lead protrusion; and
   a bottom encapsulation surrounding a lead bottom side of the lead, the lead protrusion over the bottom encapsulation for anchoring the lead to the bottom encapsulation, and wherein the bottom encapsulation includes a system recess.

2. The system as claimed in claim 1 wherein the lead includes a top ring.

3. The system as claimed in claim 1 wherein the lead includes a top ball pad on a lead top side of the lead.

4. The system as claimed in claim 1 further comprising a system interconnect on the lead bottom side of the lead.

5. The system as claimed in claim 1 wherein the lead includes a top ring at the lead top side of the lead.

6. The system as claimed in claim 5 further comprising a support pad between the die paddle and the lead.

7. The system as claimed in claim 5 wherein the bottom encapsulation includes a paddle recess for exposing the die paddle from the bottom encapsulation.

8. The system as claimed in claim 5 further comprising a chip interconnect attached between the integrated circuit device and the lead.

9. The system as claimed in claim 5 further comprising an attach layer between the integrated circuit device and the die paddle.

* * * * *